(12) United States Patent
Tsujioka

(10) Patent No.: US 6,885,053 B1
(45) Date of Patent: Apr. 26, 2005

(54) NONVOLATILE MEMORY AND ERASING METHOD

(75) Inventor: Tsuyoshi Tsujioka, Osaka (JP)

(73) Assignee: The National University Corporation Osaka Kyoiku University, Osaka (JP)

(*) Notice: Subject to any disclaimer, the term of this patent is extended or adjusted under 35 U.S.C. 154(b) by 0 days.

(21) Appl. No.: 10/782,916

(22) Filed: Feb. 23, 2004

(30) Foreign Application Priority Data

Oct. 31, 2003 (JP) ........................................ 2003-372662

(51) Int. Cl.[7] .......................................... H01L 27/108
(52) U.S. Cl. ..................... 257/296; 257/40; 257/295; 257/298; 257/431
(58) Field of Search .......................... 257/296, 40, 295, 257/298, 431

(56) References Cited

U.S. PATENT DOCUMENTS 6,828,685 B1 * 12/2004 Stasiak ........................ 257/777

OTHER PUBLICATIONS

Tsuyoshi Tsujioka, et al., "Organic bistable molecular memory using photochromic diarylethene," Applied Physics Letters, vol. 83, No. 5, Aug. 2003, pp. 937–939.

* cited by examiner

Primary Examiner—David Nelms
Assistant Examiner—Tu-Tu Ho
(74) Attorney, Agent, or Firm—Oblon, Spivak, McClelland, Maier & Neustadt, P.C.

(57) ABSTRACT

There is provided a nonvolatile memory including memory cells each of which includes a storage element including a bistable molecular layer, wherein the bistable molecular layer contains a bistable molecule which brings about isomerization from a first isomer into a second isomer by injecting a hole and an electron into the bistable molecular layer, and brings about isomerization from the second isomer into the first isomer by irradiating the bistable molecular layer with erase light, and the memory is configured to irradiate the bistable molecular layers of all the memory cells with the erase light while applying an electric field to the bistable molecular layer of only a part of the memory cells that stores information to be held when erasing information stored in the rest of the memory cells.

9 Claims, 2 Drawing Sheets

NONVOLATILE MEMORY AND ERASING METHOD

CROSS-REFERENCE TO RELATED APPLICATIONS

This application is based upon and claims the benefit of priority from prior Japanese Patent Application No. 2003-372662, filed Oct. 31, 2003, the entire contents of which are incorporated herein by reference.

BACKGROUND OF THE INVENTION

1. Field of the Invention

The present invention relates to a nonvolatile memory and an erasing method of erasing information written in the nonvolatile memory.

2. Description of the Related Art

Each memory cell in semiconductor memories such as a DRAM (Dynamic Random Access Memory) or an EEPROM (Electrically Erasable Programmable Read-Only Memory) is usually composed of a transfer element such as a transistor and a storage element such as capacitor or a transistor with a floating gate. Semiconductor memories with high storage capacity have been conventionally realized by an advance of a fine processing technique, and it is expected that finer transfer elements would be realized in the future. On the other hand, realization of finer storage elements has been already up against a difficulty. This obstructs realization of semiconductor memories with higher storage capacity.

As a memory capable of realizing a higher storage capacity, the present inventors propose a nonvolatile memory using photochromic molecules for a storage element in Applied Physics Letters, Volume 83, Number 5, Pages 937–939.

The photochromic molecule used in the memory is a bistable molecule which can take two stable structures in a regular operating temperature range. Isomerization of the bistable molecule from a first isomer to a second isomer and its reverse reaction can be brought about when irradiated with light rays having different wavelengths, i.e., write light and erase light, respectively.

The isomerization from the first isomer to the second isomer can also be brought about by injecting holes and electrons into the bistable molecular layer containing the bistable molecules. That is, information can be electrically written in the nonvolatile memory. Further, since the electroconductive characteristics of the storage element vary in accordance with a molar ratio of the first isomer to the second isomer, information written in the nonvolatile memory can be electrically read out.

However, in order to erase information written in the nonvolatile memory, the bistable molecular layer must be irradiated with the erase light. The erase light irradiation is carried out to a relatively large area, which is typically an area corresponding to all memory cells, unless a mechanical control is performed. Since the mechanical control considerably lowers an erasing speed, it is practically not possible to selectively erase a part of the information written in this nonvolatile memory.

BRIEF SUMMARY OF THE INVENTION

It is an object of the present invention to make selective and high-speed erasing of information, which is written in a nonvolatile memory using bistable molecules for a storage element, possible.

According to a first aspect of the present invention, there is provided a nonvolatile memory comprising memory cells each of which comprises a storage element including a bistable molecular layer, wherein the bistable molecular layer contains a bistable molecule which brings about isomerization from a first isomer into a second isomer by injecting a hole and an electron into the bistable molecular layer, and brings about isomerization from the second isomer into the first isomer by irradiating the bistable molecular layer with erase light, and the memory is configured to irradiate the bistable molecular layers of all the memory cells with the erase light while applying an electric field to the bistable molecular layer of only a part of the memory cells that stores information to be held when erasing information stored in the rest of the memory cells.

According to a second aspect of the present invention, there is provided a method of erasing information written in a nonvolatile memory, the nonvolatile memory comprising memory cells each of which comprises a storage element including a bistable molecular layer, the bistable molecular layer containing a bistable molecule which brings about isomerization from a first isomer into a second isomer by injecting a hole and an electron into the bistable molecular layer, and brings about isomerization from the second isomer into the first isomer by irradiating the bistable molecular layer with erase light, comprising irradiating the bistable molecular layers of all the memory cells with the erase light while applying an electric field to the bistable molecular layer of a part of the memory cells to erase information stored in the rest of the memory cells without erasing information stored in the part of the memory cells.

DETAILED DESCRIPTION OF THE INVENTION

An embodiment of the present invention will now be described with reference to the accompanying drawings. Incidentally, the constituent elements performing the same or similar functions are denoted by the same reference symbols in the respective drawings so as to avoid the overlapping description.

Figure 1:
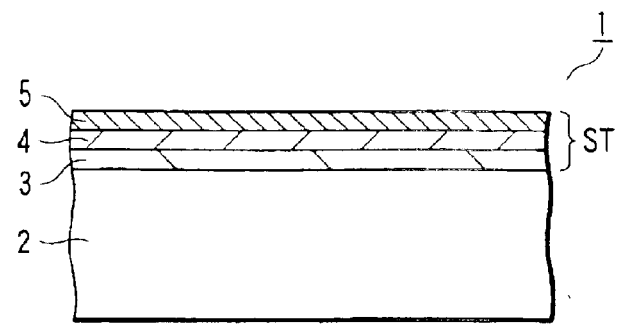
FIG. 1 is a cross-sectional view schematically showing a nonvolatile memory according to an embodiment of the present invention.
Figure 2:
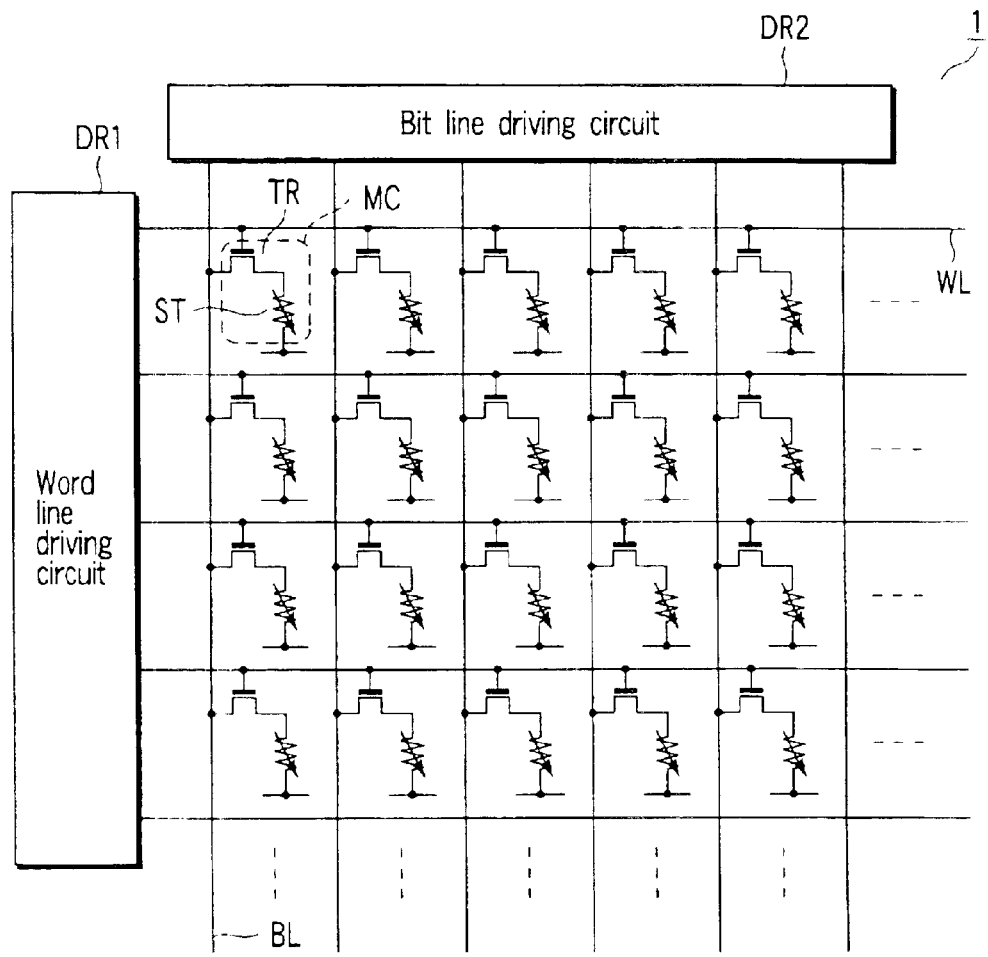
FIG. 2 is an equivalent circuit diagram of a nonvolatile memory according to an embodiment of the present invention.

FIG. 1 is a cross-sectional view schematically showing a nonvolatile memory according an embodiment of the present invention. FIG. 2 is an equivalent circuit diagram of a nonvolatile memory according to an embodiment of the present invention.

The nonvolatile memory 1 includes a semiconductor substrate 2. On the semiconductor substrate 2, formed are word lines WL, bit lines BL intersecting the word liens WL, transfer elements TR arranged in the vicinity of each intersection of the word line WL and the bit line BL, and first electrodes 3 connected to the bit lines BL via the transfer elements TR, respectively, and arranged in the column and row directions on one main surface of the semiconductor substrate 2.

On the semiconductor substrate 2, further formed are a word line driving circuit DR1 connected to the word lines WL, a bit line driving circuit DR2 connected to the bit lines BL, and sense amplifiers (not shown) connected to bit lines BL, respectively. In this example, although the transfer element TR is composed of one field effect transistor, the transfer element TR may be composed of any other switching element or of switching elements.

The first electrode 3 is covered with a bistable molecular layer 4. The bistable molecular layer 4 is covered with a second electrode 5 which is a transparent electrode. In this example, the first electrodes 3 and parts of the bistable molecular layer 4 and a second electrode 5 corresponding to the first electrodes 3 constitute storage elements ST.

Furthermore, in this example, each memory cell MC is composed of one transfer element TR and one storage element ST.

The nonvolatile memory 1 is used in combination with a light source (not shown) for erasing information and a controller (not shown). The light source is arranged, for example, substantially right in front of the second electrode such that the bistable molecular layer can be irradiated with erase light through the second electrode 5. The controller performs various controls such as supply of signals to the word line driving circuit DR1 or the bit line driving circuit DR2, processing of signals output from the sense amplifier, ON/OFF of the light source for information erasure, and others.

A relationship between two isomers of bistable molecules which can be used in the nonvolatile memory shown in FIGS. 1 and 2 and information "0" and "1" will be illustrated below. It is to be noted that "Me" represents a methyl group in the following chemical formulae.

FIRST ISOMER: "0"

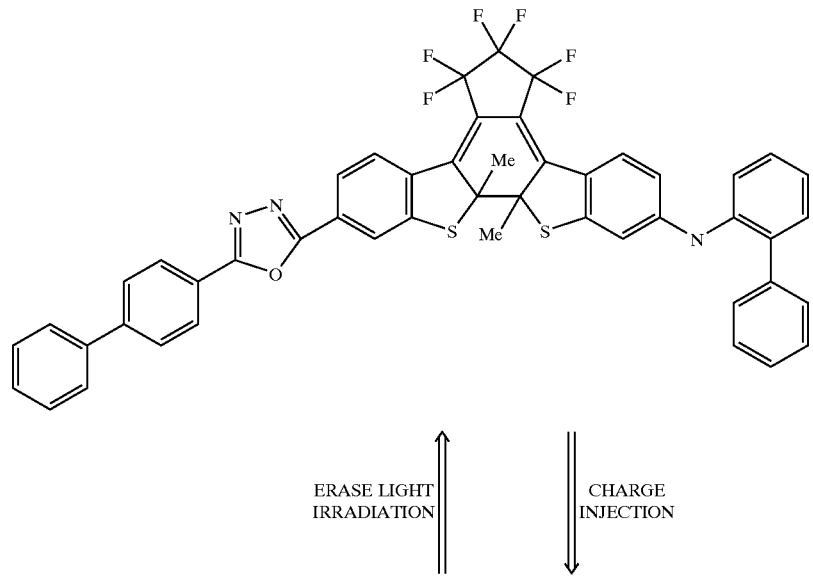

ERASE LIGHT IRRADIATION      CHARGE INJECTION

SECOND ISOMER: "1"

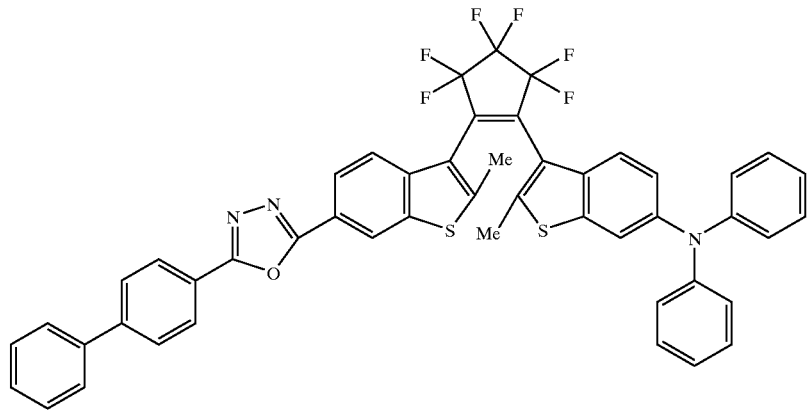

The compound represented by one of the above chemical formulae is isomer of the compound represented by the other of the above chemical formulae. Both the first and second isomers are stable in a relatively wide temperature range including a room temperature.

Isomerization from the first isomer to the second isomer can be brought about by injecting holes and electrons into the bistable molecular layer 4. That is, an excited state that a hole exists at an HOMO (Highest Occupied Molecular Orbital) of the first isomer and an electron exists at an LUMO (Lowest Unoccupied Molecular Orbital) can be generated by the charge injection, and the first isomer can be isomerized into the second isomer through this excited state. Therefore, binary information can be written, for example, by defining a state that a ratio of the second isomer to the first isomer in the bistable molecular layer is smaller and a state that the ratio is larger as information "0" and "1", respectively.

Moreover, an electrical resistivity of the storage element ST is increased as the ratio of the second isomer to the first isomer in the bistable molecular layer 4 becomes larger. Therefore, information held in the storage element ST can be read, for example, by applying a constant voltage to the storage element ST and detecting a current flowing therethrough.

It is to be noted that a voltage applied to the storage element ST in reading is set to be sufficiently lower than a voltage applied to the storage element ST in writing. If a difference between an ionization energy of the bistable molecular layer 4 and a work function of the first electrode 3 is different from a difference between a work function of the second electrode 5 and an electron affinity of the bistable molecular layer 4, charges injected into the bistable molecular layer 4 can be either holes or electrons. In this case, since the excited state described in connection with writing is not generated, isomerization of the bistable molecules does not occur. That is, non-destructive read-out is possible.

Isomerization from the second isomer to the first isomer can be brought about by irradiating the bistable molecular layer 4 with ultraviolet rays as the erase light. The excited state that a hole exists at the HOMO of the second isomer and an electron exists at the LUMO is generated by erase light irradiation, and the second isomer is isomerized into the first isomer through this excited state. That is, the information "1" held in the storage element ST can be rewritten into the information "0" by irradiating the bistable molecular layer 4 with the erase light. Additionally, since the first isomer and the second isomer have different absorbing wavelength bands, the first isomer is not isomerized into the second isomer by erase light irradiation. That is, the information "0" held in the storage element ST is not rewritten into the information "1" by irradiating the bistable molecular layer 4 with the erase light. Therefore, the information held in the storage element ST can be changed to information "0", in order words, the information held in the storage element ST can be erased with respect to all the memory cells MC by erase, light irradiation.

Meanwhile, in this embodiment, information held in some memory cells MC can be selectively erased by, e.g., the following method.

Figures 3A, 3B:
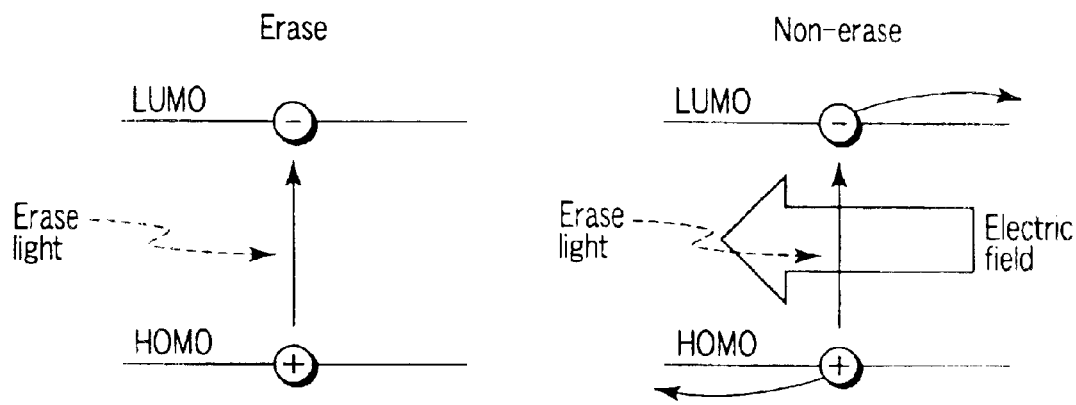
FIGS. 3A and 3B are views schematically showing a method of selectively erasing information held in memory cells.

FIGS. 3A and 3B are views schematically showing a method of selectively erasing information held in the memory cells.

As described above, when the bistable molecular layer 4 is irradiated with the erase light, the excited state that a hole exists at the HOMO of the second isomer and an electron exists at LUMO is generated, and the second isomer is isomerized into the first isomer through this excited state. At this time, for example, when an electric field is applied to the bistable molecular layer 4 by utilizing, e.g., the first electrode 3 and the second electrode 5, the hole at the HOMO receives a force in the same direction as that of the electric field, and the electron at LUMO receives a force in an opposite direction. If the intensity of this electric field is sufficiently high, a hole and an electron generated by irradiation of the erase light in a given bistable molecule move in opposite directions toward a pair of bistable molecules sandwiching the above molecule. As a result, the bistable molecule which has generated the hole and the electron returns to a ground state from the excited state. Therefore, this bistable molecule is not isomerized from the second isomer into the first isomer.

Further, the hole and the electron which have moved from the above-described bistable molecule toward the pair of bistable molecules sandwiching the particular molecule further increase a distance therebetween by the effect of the electric field. Usually, a work function of the first electrode 3 is smaller than the ionization energy of the bistable molecular layer 4, and a work function of the second electrode 5 is larger than the electron affinity of the bistable molecular layer 4. Therefore, the hole and the electron generated by erase light irradiation rapidly flow from the bistable molecular layer 4 toward the first electrode 3 and the second electrode 5, respectively. Thus, a probability that holes and electrons generated by erase light irradiation are recombined in the bistable molecular layer 4 can be sufficiently reduced, and hence bistable molecules are rarely isomerized from the second isomer into the first isomer due to holes and electrons generated in the other bistable molecules.

That is, as shown in FIG. 3A, when the bistable molecular layer 4 is irradiated with the erase light without applying the electric field, the information "1" held in the memory cell MC can be rewritten into the information "0". Furthermore, as shown in FIG. 3B, when the bistable molecular layer 4 is irradiated with the erase light while applying the electric field, the information "1" held in the memory cell MC can be prevented from being rewritten into the information "0".

It is to be noted that isomerization from the is first isomer into the second isomer can be brought about when both holes and electrons are injected into the bistable molecular layer 4 by application of the electric field. Injection of both holes and electrons into the bistable molecular layer by application of the electric field can be suppressed, for example, by setting a voltage applied between the first electrode 3 and the second electrode 5 to be sufficiently smaller than that in writing. Alternatively, as described below, where a polarity of the voltage applied to the storage element ST in erasing is opposite to that in writing, it is possible to suppress injection of both holes and electrons into the bistable molecular layer by application of the electric field even if a relatively high voltage is applied.

A work function of the first electrode 3 as an anode and a work function of the second electrode 5 as a cathode lie between the electron affinity and the ionization energy of the bistable molecular layer 4. Usually, a metal material having a larger work function is used for the first electrode 3 as an anode, and a metal material having a smaller work function is used for the second electrode 5 as a cathode. As a result, a potential barrier for injecting hole from the first electrode 3 into the bistable molecular layer 4 and a potential barrier for injecting electron from the second electrode 5 into the bistable molecular layer 4 can be set relatively small.

In such a structure, the potential barrier for injecting electron from the first electrode 3 into the bistable molecular layer 4 and the potential barrier for injecting hole from the second electrode 5 into the bistable molecular layer 4 are relatively large. Therefore, in erasing, by applying a first voltage between the first electrode 3 and the second electrode 5 such that the second electrode 5 has a higher electric potential than that of the first electrode 3, both holes and electrons can be suppressed from being injected into the bistable molecular layer 4 on application of the electric field even if the first voltage is relatively high.

When writing the information "1", holes and electrons can be efficiently injected into the bistable molecular layer 4 by applying a second voltage having a polarity opposite to that of the first voltage 1 between the first electrode 3 and the second electrode 5. Furthermore, the non-destructive read-out is possible with a small power consumption in the case where a third voltage which has the same polarity as that of the second voltage and is sufficiently smaller than the second voltage is applied between the first electrode 3 and the second electrode 5 and a current flowing through the storage element ST is detected.

The following structure may be employed in the storage element ST.

Figure 4:
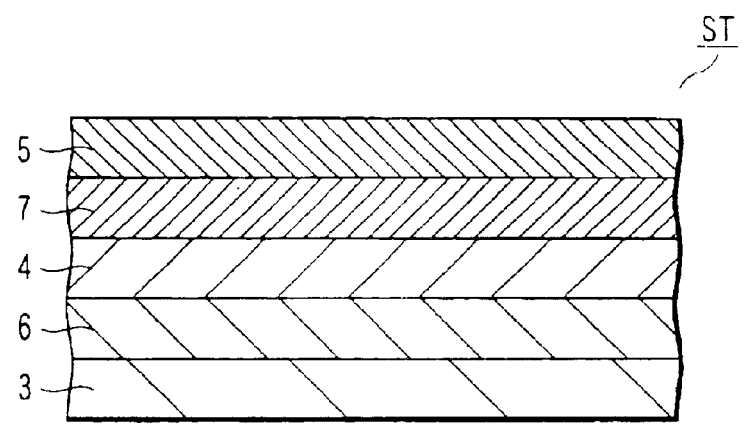
FIG. 4 is a cross-sectional view schematically showing an example of a structure which can be employed in a storage element.

FIG. 4 is a cross-sectional view schematically showing an example of a structure which can be employed in the storage element.

The storage element ST includes a hole injection layer 6 between the first electrode 3 and the bistable molecular layer 4. Moreover, the storage element ST includes an electron injection layer 7 between the second electrode 5 and the bistable molecular layer 4.

The ionization energy of the hole injection layer 6 is smaller than the ionization energy of the bistable molecular layer 4. Additionally, the electron affinity of the hole injection layer 6 is smaller than the electron affinity of the bistable molecular layer 4. Further, the work function of the first electrode 3 and the electron affinity of the bistable molecular layer 4 lie between the ionization energy and the electron affinity of the hole injection layer 6.

On the other hand, the electron affinity of the electron injection layer 7 is larger than the electron affinity of the bistable molecular layer 4. Furthermore, the ionization energy of the electron injection layer 7 is larger than the ionization energy of the bistable molecular layer 4. Moreover, the work function of the second electrode 5 and the ionization energy of the bistable molecular layer 4 lie between the ionization energy and the electron affinity of the electron injection layer 7.

When such a structure is employed, the potential barriers for injecting hole and electron on application of the first voltage becomes larger. Therefore, even if the first voltage is higher, both holes and electrons can be suppressed from being injected into the bistable molecular layer 4 on application of the first voltage. It is to be noted that this effect can be also obtained when only one of the hole injection layer 6 and the electron injection layer 7 is provided to the storage element ST. Moreover, this effect can be likewise obtained when a hole transporting layer is interposed between the hole injection layer 6 and the bistable molecular layer 4 or when an electron transporting layer is interposed between the electron injection layer 7 and the bistable molecular layer 4.

As described above, in this erasing method, all the bistable molecular layers 4 are irradiated with the erase light while applying the electric field, i.e., supplying hold signals, to the storage elements ST of the memory cells MC that store information to be held without applying the electric field to the storage elements ST of the memory cells MC that store information to be erased. Therefore, in the word line driving circuit DR1, a structure that a signal for causing the transfer elements TR to be in a conductive state can be supplied to only one of the word lines WL at a time and a structure that such signals can be simultaneously supplied to a plurality of the word lines WL are employed. Likewise, in the bit line driving circuit DR2, a structure that the hold signal can be supplied to only one of the bit lines BL at a time and a structure that the hold signals can be simultaneously supplied to a plurality of the bit lines BL are employed.

Incidentally, when the circuit configuration shown in FIG. 2 is employed, information can be erased by, for example, the memory cell group composed of memory cells MC arranged in a line in the row direction or the memory cell group composed of memory cells MC arranged in a line in the column direction. Alternatively, when other circuit configurations are employed, information can be erased by the memory cell MC.

In the above-described nonvolatile memory 1, various compounds can be used as the bistable molecule in addition to an organic compound represented in the above chemical formulae. Typical bistable molecules which can be used in the nonvolatile memory 1 will be exemplified bellow.

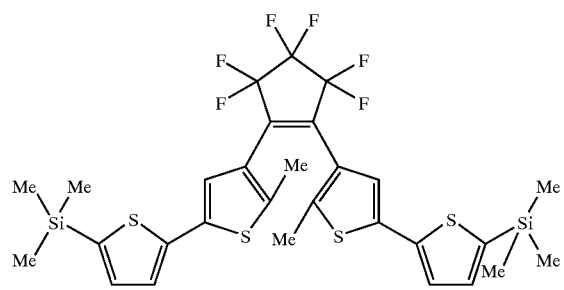

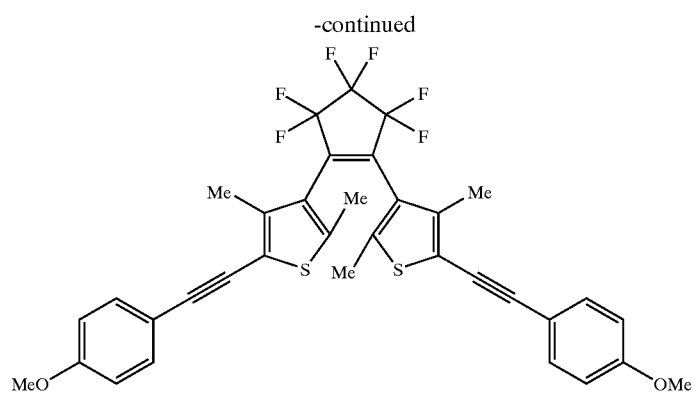
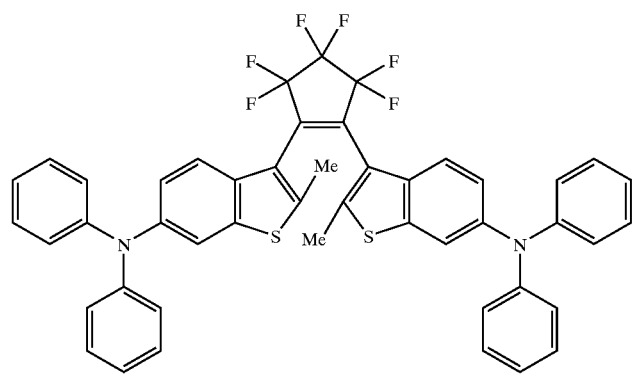
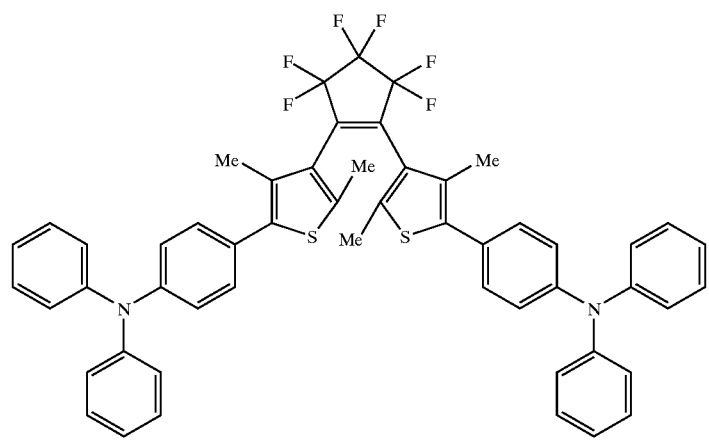
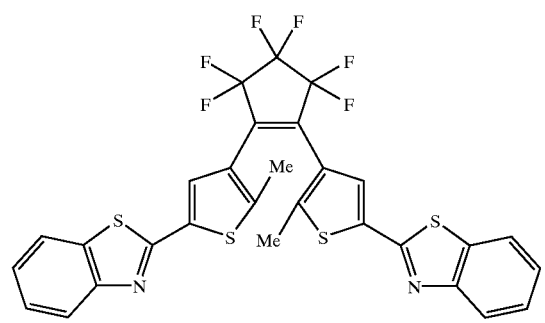

-continued

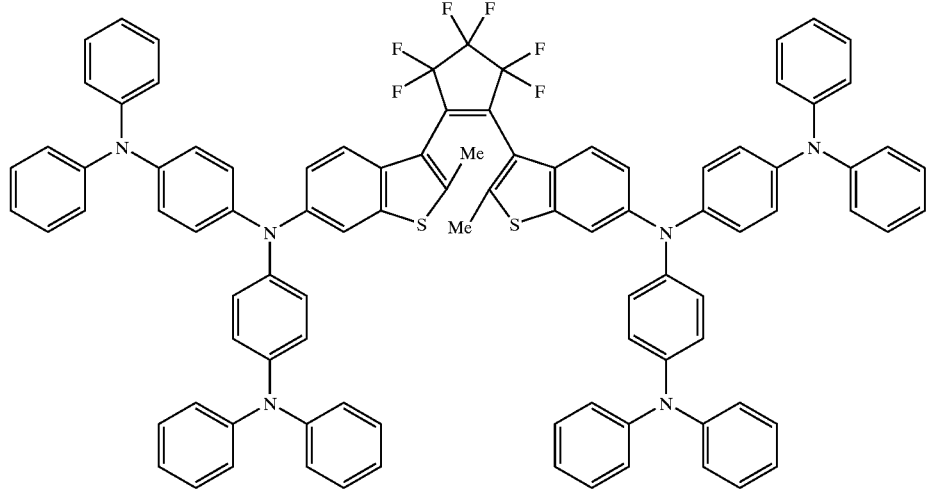

The bistable molecular layer 4 may contain one type of bistable molecule or contain a plurality of types of bistable molecules. Further, the bistable molecular layer 4 may further contain other materials in addition to the bistable molecules. For example, the bistable molecular layer 4 may further contain a later-exemplified material in relation to the hole injection layer 6 or the electron transporting layer 7. The bistable molecular layer 4 does not have to be divided correspondingly to the storage elements ST, and it may be a continuous film. The bistable molecular layer 4 may be formed by, e.g., evaporation.

As a material of the first electrode 3, it is possible to use an inorganic conductor like a cathode of an OLED (Organic Light-Emitting Diode), e.g., a metal such as magnesium or an alloy such as a magnesium-indium alloy. The first electrode 3 can be obtained by forming a continuous film by, e.g., a sputtering method and then pattering this film.

As a material of the second electrode 5, it is possible to use an inorganic conductor like an anode of the OLED, e.g., ITO (Indium Tin Oxide). The second electrode 5 does not have to be divided correspondingly to the storage elements ST, and it may be a continuous film. The second electrode 5 can be formed by, e.g., a sputtering method.

It is to be noted that the first electrode 3, the bistable molecular layer 4 and the second electrode 5 are sequentially stacked on the substrate 2 in FIG. 1, but they may be stacked in the reverse order. In any case, the electrode positioned on the light source side must be capable of transmitting the erase light therethrough.

As materials of the hole injection layer 6 and the hole transporting layer, it is possible to use the same materials as those of the hole injection layer or the hole transporting layer in the OLED, e.g., organic materials such as a oligoamine or oligothiophene, an inorganic semiconductor such as vanadium oxide, or an inorganic insulator such as lithium fluoride. Incidentally, as the hole transporting layer, one having the ionization energy which lies between the ionization energy of the hole injection layer 6 and the ionization energy of the bistable molecular layer 4 is usually used. The hole injection layer 6 and the hole transporting layer do not have to be divided in accordance with each storage element ST, and they may be continuous films. The hole injection layer 6 and the hole transporting layer can be formed by, e.g., the evaporation method.

As materials of the electron injection layer 7 and the electron transporting layer, it is possible to use the same material as that of the electron injection layer or the electron transporting layer in the OLED, e.g., an organic material such as a oxadiazole-based material, or an organometallic complex such as $Alq_3$. Incidentally, as the electron transporting layer, one having the electron affinity which lies between the electron affinity of the electron injection layer 7 and the electron affinity of the bistable molecular layer 4 is usually used. The electron injection layer 7 and the electron transporting layer do not have to be divided correspondingly to the storage elements ST, and they may be continuous films. The electron injection layer 7 and the electron transporting layer can be formed by, e.g., the evaporation method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile memory comprising memory cells each of which comprises a storage element including a bistable molecular layer,
    wherein the bistable molecular layer contains a bistable molecule which brings about isomerization from a first isomer into a second isomer by injecting a hole and an electron into the bistable molecular layer, and brings about isomerization from the second isomer into the first isomer by irradiating the bistable molecular layer with erase light, and
    the memory is configured to irradiate the bistable molecular layers of all the memory cells with the erase light while applying an electric field to the bistable molecular layer of only a part of the memory cells that stores information to be held when erasing information stored in the rest of the memory cells.

2. The memory according to claim 1, wherein the storage element further includes a first electrode facing one main surface of the bistable molecular layer and a second electrode facing the other main surface of the bistable molecular layer.

3. The memory according to claim 2, wherein the storage element further includes a hole injection layer between the first electrode and the bistable molecular layer.

4. The memory according to claim 2, wherein the storage element further includes an electron injection layer between the second electrode and the bistable molecular layer.

5. The memory according to claim 2, wherein the first electrode is larger in work function than the second electrode, and the memory is configured to form the electric field by applying a first voltage between the first and second electrodes such that the second electrode has a higher potential than that of the first electrode.

6. The memory according to claim 5, wherein the memory is configured to inject a hole and an electron into the bistable molecular layer from the first and second electrodes, respectively, by applying a second voltage whose polarity is opposite to that of the first voltage between the first and second electrodes of one of the memory cells when writing information "0" or "1" into the memory cell.

7. The memory according to claim 6, wherein the memory is configured to detect a current flowing through the storage element of one of the memory cells while applying a third voltage which has the same polarity as that of the second voltage and is smaller than the second voltage between the first and second electrodes of the memory cell when reading out information stored in the memory cell.

8. A method of erasing information written in a nonvolatile memory, the nonvolatile memory comprising memory cells each of which comprises a storage element including a bistable molecular layer, the bistable molecular layer containing a bistable molecule which brings about isomerization from a first isomer into a second isomer by injecting a hole and an electron into the bistable molecular layer, and brings about isomerization from the second isomer into the first isomer by irradiating the bistable molecular layer with erase light, comprising:

irradiating the bistable molecular layers of all the memory cells with the erase light while applying an electric field to the bistable molecular layer of a part of the memory cells to erase information stored in the rest of the memory cells without erasing information stored in the part of the memory cells.

9. The method according to claim 8, wherein the storage element further includes a first electrode facing one main surface of the bistable molecular layer and a second electrode facing the other main surface of the bistable molecular layer, the first electrode is larger in work function than the second electrode, and the electric field is formed by applying a voltage between the first and second electrodes such that the second electrode has a higher potential than that of the first electrode.

* * * * *